United States Patent [19]

Mangelsdorf

[11] Patent Number: 4,884,075
[45] Date of Patent: Nov. 28, 1989

[54] DECODING CIRCUIT FOR FLASH-TYPE ANALOG-TO-DIGITAL CONVERTER

[75] Inventor: Christopher W. Mangelsdorf, Reading, Mass.

[73] Assignee: Analog Devices, Inc., Norwood, Mass.

[21] Appl. No.: 196,035

[22] Filed: May 19, 1988

[51] Int. Cl.[4] .............................................. H03M 1/36
[52] U.S. Cl. ..................................... 341/159; 341/155
[58] Field of Search ................... 341/97, 159, 108, 68, 341/54, 94, 63

[56] References Cited

U.S. PATENT DOCUMENTS

| | | | |
|---|---|---|---|
| 4,596,978 | 6/1986 | Fujita | 341/347 |
| 4,719,447 | 1/1988 | Garuts | 341/159 |

OTHER PUBLICATIONS

Peetz et al., "An 8-bit 250 Megasample per Second Analog-to-Digital Converter: Operation without a Sample and Hold", *IEEE Journal of Solid-State Circuits*, vol. SC-21, 12/86, pp. 997–1002.

Primary Examiner—William M. Shoop, Jr.
Assistant Examiner—Helen Kim
Attorney, Agent, or Firm—Wolf, Greenfield & Sacks

[57] ABSTRACT

In a parallel (or "flash") type analog-to-digital converter (ADC), a decoding technique and apparatus. First, the output of every comparator is examined relative to its nearest neighbors. If, for comparator "n", the outputs of "neighboring" comparators "n+1" and "n−1" both are in a different state than the output of comparator "n", the output state of comparator "n" is reversed. That is, each group of three adjacent comparators (n−1, n and n+1) is examined and the output of the "center" comparator is "corrected" by substituting the majority state of the three comparators for the output of the "center" comparator (i.e., comparator "n"). Second, the zeroes-to-ones transition point is found in the thus-corrected outputs. Once the transition point is found, a conventional encoding produces a digital output word. Circuitry is provided for the efficient implementation of the method and for performing the method in an equivalent single step.

11 Claims, 7 Drawing Sheets

| n | C(n) | C'(n) |
|---|------|-------|
| 6 | 0 | 0 |
| 5 | 0 | 0 |
| 4 | 0 | 0 |
| 3 | 1 | 0 |
| 2 | 0 | 1 |
| 1 | 1 | 1 |
| 0 | 1 | 1 |

FOR EACH ADJACENT PAIR OF COMPARATOR BANKS "j" AND "j+1", GENERATE C'(j, MSB) AS THE MAJORITY VALUE OF C(j, MSB-1), C(j, MSB) AND C(j+1, LSB)

↓

COMPARE C'(j, MSB)'S TO FIND BANK HAVING MSB OF RESULT

DECODING CIRCUIT FOR FLASH-TYPE ANALOG-TO-DIGITAL CONVERTER

FIELD OF THE INVENTION

This invention relates to analog-to-digital data converters ("ADC's") and, more particularly to ADC's of the "flash" type.

BACKGROUND OF THE INVENTION

Analog-to-digital converters are devices, ranging from monolithic integrated circuits to high-performance hybrid circuits and modules which convert analog data or signals (hereinafter collectively identified as "data") into an equivalent digital form. The analog data is most often, but certainly not always, a voltage.

The key characteristics of ADC's which distinguish one from another include absolute and relative accuracy, linearity, presence or absence of missing codes, resolution, conversion speed, stability and price. Other aspects open to choice include input signal ranges, digital output codes, interfacing techniques, presence of on-board multiplexing, signal conditioning, and memory.

There are several types of ADC's. The most common type is probably the successive approximation converter, which often represents an acceptable compromise between speed and accuracy. Other popular alternatives are based upon integrating techniques (such as the dual-ramp, quad-slope and voltage-to-frequency converters), counting and tracking techniques (e.g., counter-comparator converters), converters employing digitally corrected subranging techniques and "flash" converters. The latter are a particularly high-speed design and are therefore useful in video signal processing and other high-frequency signal conversion situations.

The hallmark of flash converters is parallel operation, which provides the very high-speed characteristics for which this type of converter is known. FIG. 1 shows a basic prior art three-bit flash converter 10. It has $2^n-1$ latched comparators, biased one LSB apart, starting with $+\frac{1}{2}$ LSB, where "n" is the number of bits. A resistive voltage divider, indicated generally at 12, operating off of a reference voltage source connected to terminal 14 but not shown, provides the reference voltages for the comparators 16-1 through 16-7. The reference voltage for each comparator 16-i is one least significant bit (LSB) higher than the reference voltage for the comparator 16-(i−1) immediately below it. The outputs of the comparators collectively provide a "thermometer code" which corresponds to the magnitude of the analog input signal. The comparator outputs are then provided, from pairs of electrically adjacent comparators, to gates 22, 24, 26, 28 and 32; the outputs from these gates, with the output from the "topmost" comparator 16-7 forms a "1 of N" selection code. The "1 of N" code is applied to an encoder 34. Though shown as an OR array using OR gates 35A, 35B and 35C to generate a three-bit binary code output, the encoder 34 could assume other common forms. The encoder 34 is sometimes referred to as a read-only memory (ROM).

Flash decoders having eight-bit resolution require 255 comparators and comparable amounts of decoding logic. It can thus be readily seen that these converters are often relatively impractical to construct from discrete comparators and logic elements, due to power, size, wiring and cost considerations. Monolithic devices have been developed, however, for flash converters ranging from 4 to 10 bits of resolution.

The obvious advantage of the flash converter of FIG. 1 is that conversion occurs in parallel, with speed limited only by the switching time of the comparators and gates. As the input changes, the output code changes. Thus, this is the fastest (or at least one of the fastest) approaches to conversion. Unfortunately, the number of elements increases geometrically with resolution.

Parallel flash conversion is often combined with digitally corrected subranging to strike a compromise that gives better resolution than the parallel approach with less complexity, but still maintaining a speed improvement over the successive approximation approach.

Additionally, although the comparator latches essentially perform a track and hold function, high-speed, high-resolution systems often employ an external track and hold element for best performance.

A functional block diagram for a typical prior art 6-bit flash converter is shown in FIG. 2. This device, a model AD9000 ADC from Analog Devices, Inc. of Norwood, Massachusetts, achieves 75 MHz word rates. As the block diagram shows, sixty-four parallel comparators 42-1 through 42-64 are employed to digitize fast-moving analog input signals. An overflow bit makes it possible to connect multiple units easily, in parallel, to obtain up to eight bits of digital data at word rates comparable to those achieved by the devices operating independently. Wired-OR logic circuits within the device encode the comparator outputs into a binary format of six bits of parallel data, along with the overflow bit.

The outputs of the comparators 42-i are applied to a corresponding set of latches 44-i controlled by the command signal applied to the ENCODE input at terminal 46. When the ENCODE command is low, the latches 44-i are transparent, establishing the "track" mode. When the ENCODE input changes to high, the latches go into a "hold" or "latched" condition, thus seizing the most recent digital outputs of the comparators and applying them to the encoding circuits. The data held in the latches is converted to binary form by the encoders 48 and 50 and the binary word is applied to the output stages 52 as a six-bit digital representation of the analog signal which was present at the comparator input 54 at the instant the ENCODE command went high.

All-flash ADC's tend to have fairly random linearity errors. The overall linearity in monolithic flash converters is determined primarily by comparator offset voltage matching and tolerance of the resistors comprising the voltage divider. Digital output codes can be missed if the offset voltages of adjacent comparators are of opposite polarities and sufficient magnitude.

The digital code at the output of the comparators in a flash converter is commonly known as "thermometer code." When everything is working ideally, the collection of comparator outputs should be analogous to an analog liquid thermometer tube: all zeroes above the input level, all ones below. The zeroes-to-ones transition point rises and falls with the input level, like the temperature sensed by a thermometer.

The thermometer code is translated to a binary output words by using the zeroes-to-ones transition point to address encoding logic such as read-only memory (ROM). FIG. 3 shows a typical circuit 60 (well-known to those skilled in the art and therefore requiring no detailed explanation) for performing this function. At each of the nodes 64-1, 64-2 and 64-3, a two-input AND function is performed on the two associated inputs from the comparators. Each of nodes 64-i drives a ROM address line 65-i. Each ROM Address line is connected to the base of one or more transistors which drive ROM output lines 62-j. For example, address line 65-1 drives transistors 66a, 66b and 66c. Note that wherever a zero is "to the right" of a one in the inputs 61-i from the comparators, a ROM output line 62-i goes high, impressing a binary code on the output lines. (That is, the circuit looks for a "10" pattern match.) When two or more of transistors 66 have their emitters connected to the same ROM output line, such as transistors 66a and 66d, the wiring together of those emitters creates a wired-OR function; that is, if two ROM lines should go high, the output will be the bit-wise OR of the two ROM outputs. Two ROM lines do sometimes go high, even though under ideal conditions this should not occur. For example, under high-input-slew-rate conditions, timing differences between signal paths or even slight differences in comparator response times can cause the effective strobe point of one comparator to be quite different from its neighbors. Since comparators are usually arranged in several rows, this problem is accentuated at the boundaries between rows, where the signals to adjacent comparators may take vastly different routes and incur concomitantly different propagation delays. Moreover, since row boundaries usually occur at major carry points, the error resulting from OR'ed codes can be substantial.

Examples of code errors of interest appear in FIGS. 4A through 4D, each of which shows a sequence of adjacent comparator outputs 70-i from a corresponding set of electrically adjacent comparators (not shown, but similar to comparators 16-i of FIG. 1) connected to the electrically adjacent taps of a voltage divider (e.g., resistive ladder; not shown) in a flash converter. The outputs 70-i occur at some arbitrary point on the voltage divider. In FIG. 4A, either the logical zero value of the output of comparator 70-2 is in error, or the logical one value of the output of comparator 70-3 is in error. Either way, there is a one-bit error. In FIG. 4B, the zero output of comparator 70-2 is most likely erroneous; of course, there is also a probability that the two ones at the outputs of comparators 70-1 and 70-3 are both in error, instead, but a two-bit error is far less likely than a single-bit error. FIG. 4C shows an example where the one at the output of comparator 70-4 is the most likely error. A two-bit error is shown in FIG. 4D. The two bits at the outputs of comparators 70-1 and 70-2 should both be ones or the two bits at the outputs of comparators 70-3 and 70-4 should both be zeroes, instead of the situation as illustrated. By analogy to a mercury thermometer, the code inconsistencies shown in FIGS. 4A-4D are like "bubbles" in the liquid "mercury" of the thermometer code. Traditionally, such bubbles have been suppressed by using what amounts to a three-input gate to address the ROM. This approach, for example, requires two zeroes and a one to cause the ROM line to go high. Such a technique resolves the errors in FIGS. 4A and 4B, but it does not resolve the errors shown in FIGS. 4C and 4D. A four-input gate would be able to detect and correct more errors, but at the expense of a considerable increase in complexity. Such complexity translates directly to consumption of increased power and integrated circuit area, as well as to an increase in product cost.

The effect of such errors on accuracy of measurement is a second problem. For example, in FIG. 4A, an input gate which requires two zeroes and a one will select position 81 as the top of the thermometer mercury, whereas a gate requiring two ones and a zero will select position 83 instead. A "best guess" correction of the error would probably indicate a position midway between positions 81 and 83 - i.e., position 82.

Accordingly, an object of the present invention is the provision of an improved decoding method and apparatus for "flash" analog-to-digital converters.

Another object of the invention is to provide a converter which provides, on average, a high accuracy error correction.

SUMMARY OF THE INVENTION

These and other objects and advantages of the invention are achieved by a decoding technique and apparatus which employs two steps. First, the output of every comparator is examined relative to its electrically nearest neighbors. If, for comparator "n", immediately "neighboring" (i.e., electrically adjacent) comparators "n+1" and "n−1" both are in a different state than comparator n, comparator n probably has the wrong answer; accordingly, its state is reversed. That is, each group of three adjacent comparators (n−1, n and n+1) is examined and the majority state is supplied as, or replaces the actual value of, the output of the "center" comparator (i.e., comparator "n"); this is referred to as a "corrected" comparator output. Second, the zeroes-to-ones transition point is found in the thus-corrected outputs. Once the transition point is found, a conventional encoding produces a digital output word.

Broadly speaking, the invention thus employs a pattern matching technique to spot and correct "invalid" bit patterns. The invention optionally also detects and corrects code errors caused by propagation or other discrepancies between different groups of comparators. Frequently, the comparators in a converter are arranged or laid out in blocks, or "banks", on an integrated circuit chip, such that each block has its own decoding logic and ROM. Additional circuitry is used to decide which of the blocks has created the correct output word, and to direct its output to the output terminals of the converter. This arrangement is prone to errors because the physical separation between the "last" comparator of a block and the "first" comparator of the next block is larger than the inter-comparator separations within a block. The increased physical separation may lead to timing or propagation delay differences between the blocks and cause thermometer code bubbles to appear at the block boundaries. Such bubbles cause large errors because the block boundaries correspond to major carry points in the output codes and because they may confuse the arbitration circuitry which is attempting to connect one block output to the converter output. The present invention alleviates such errors in two ways, or provides two :"tiers" of defense against these errors. First, the invention insures that the output code generated in each block is more immune to the bubbles at the boundary, by ensuring correct addressing of the ROM. Second, the "corrected" comparator outputs may be used by the arbitration circuitry to select the appropriate block when bubbles are present.

The invention is pointed out with particularity in the appended claims. The above and further objects, features and advantages of the invention may be better understood by referring to the following detailed description, which should be read in conjunction with the accompanying drawing.

DETAILED DESCRIPTION

Figure 1:
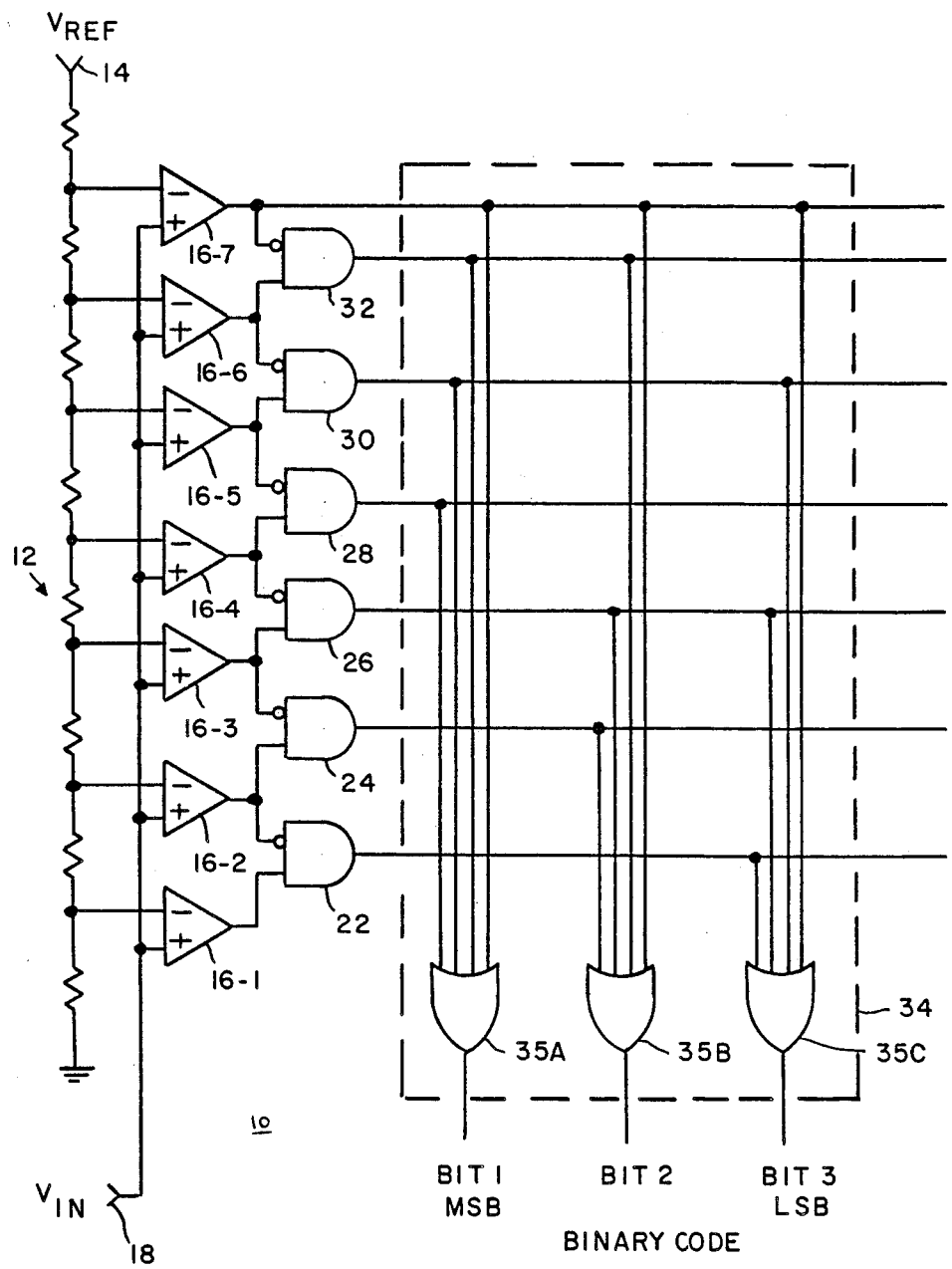
FIG. 1 is a schematic circuit diagram illustrating in simplified form a conventional prior art three-bit parallel ("flash") ADC with Gray code output.
Figure 2:
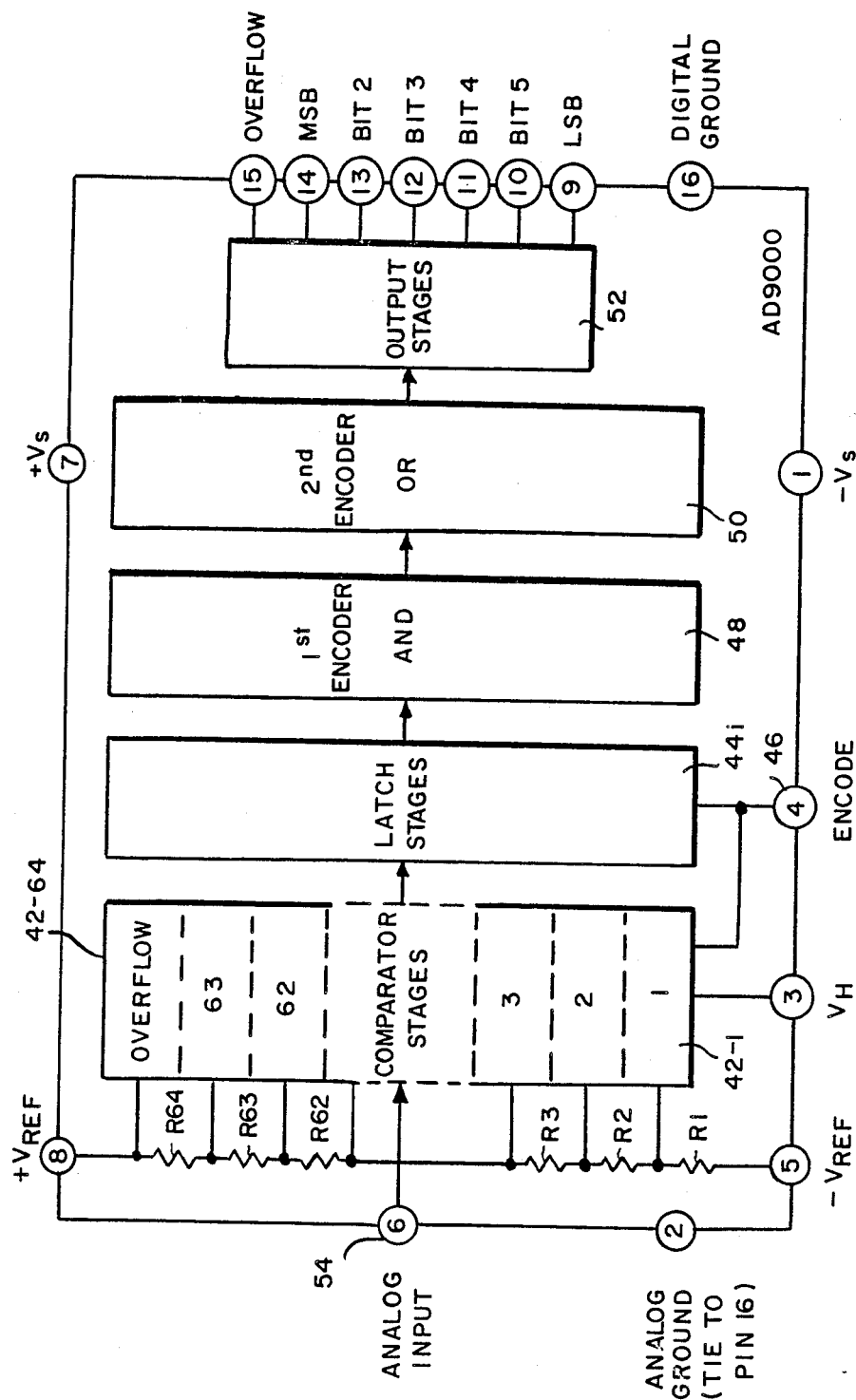
FIG. 2 is a block diagram of a commercial prior art six-bit flash ADC, illustrating the use of comparator output latches.
Figure 3:
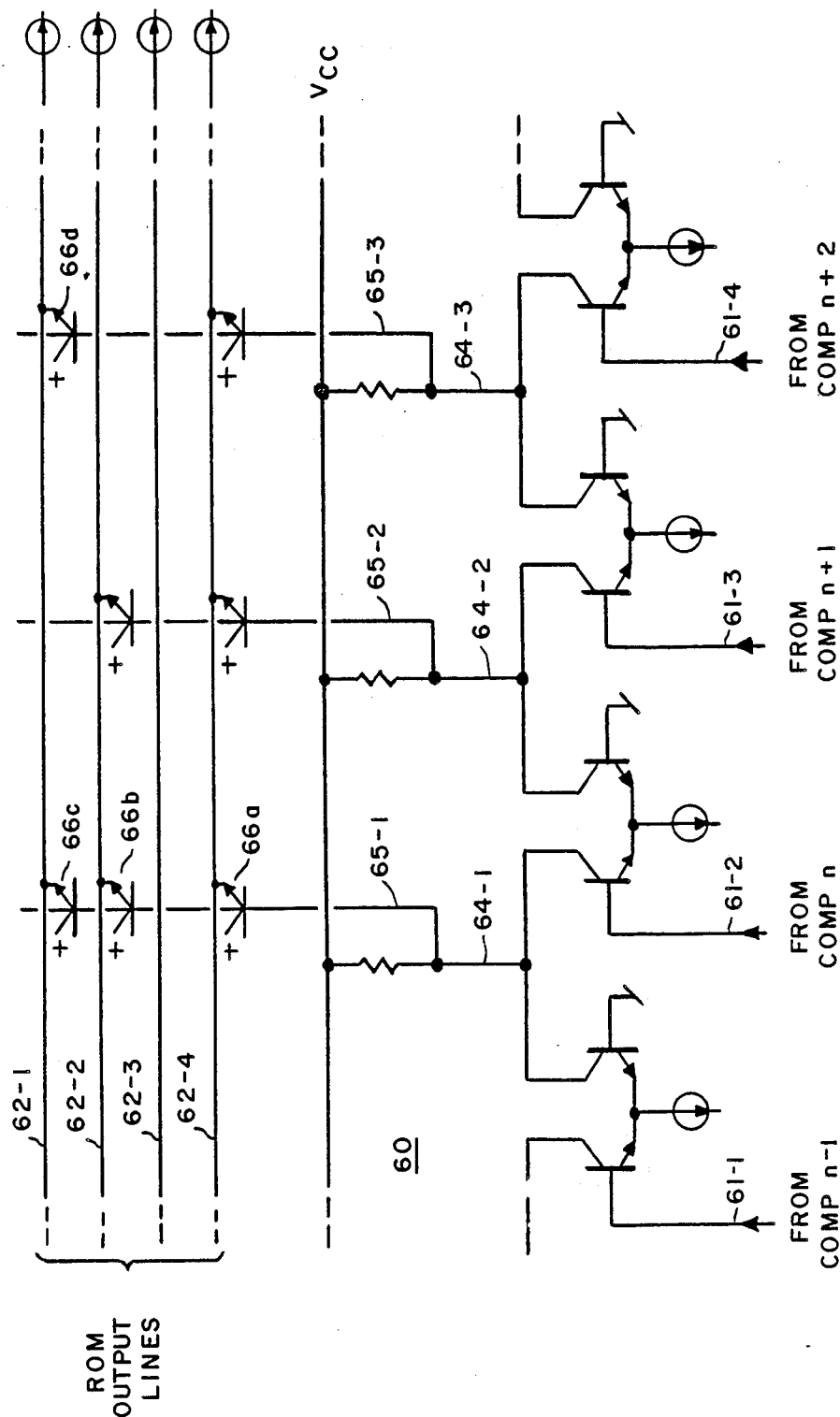
FIG. 3 is a simplified schematic circuit diagram of a conventional prior art circuit for addressing a ROM for encoding the output of the comparators in a flash ADC.
Figures 4A, 4B, 4C, 4D, 5:
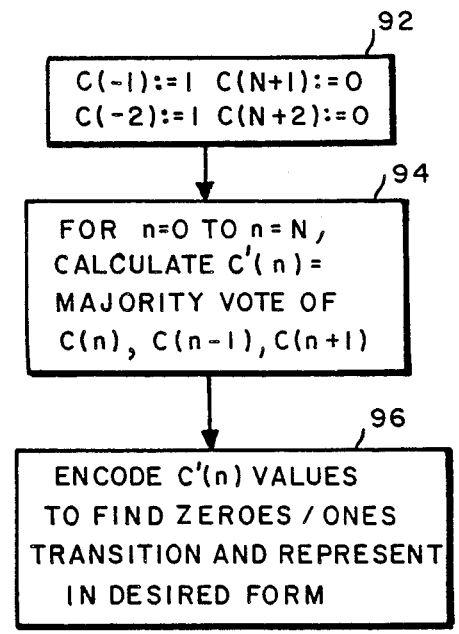
FIGS. 4A-4D are illustrations of different types of flash converter comparator output errors which it is the goal of the present invention to correct.
FIG. 5 is a flow diagram illustrating the steps of the basic method according to the present invention.

The method of the present invention is illustrated in FIG. 5, in its basic, "first tier" form. This method is useful whether or not the converter is segmented into a plurality of "banks," and therefore may be used either by itself or together with the "second tier" correction mechanism. The comparators are connected to the taps of a voltage divider such as the resistive divider shown in FIG. 1. For the least significant and most significant comparators (i.e., C(O) and C(N)), two fictitious neighbors [C(−1) and C(−2) for C(0) and C(N+1) and C(N+2) for C(N), respectively] are assumed. The values of these fictitious neighbors are assigned as follows: C(−1)=C(−2)=1; C(N+1)=C(N+2)=0. (Step 92.) For each comparator, "n", where "n" ranges from 0 to an upper limit N, a corrected comparator output state C'(n) is calculated as the majority state of uncorrected comparator outputs C(n−1), C(n) and C(n+1). (Step 94.) Next, the collection of values for C'(n) is decoded to find the zeroes-to-one transition point. (Step 96.)

Figures 6, 7, 10:
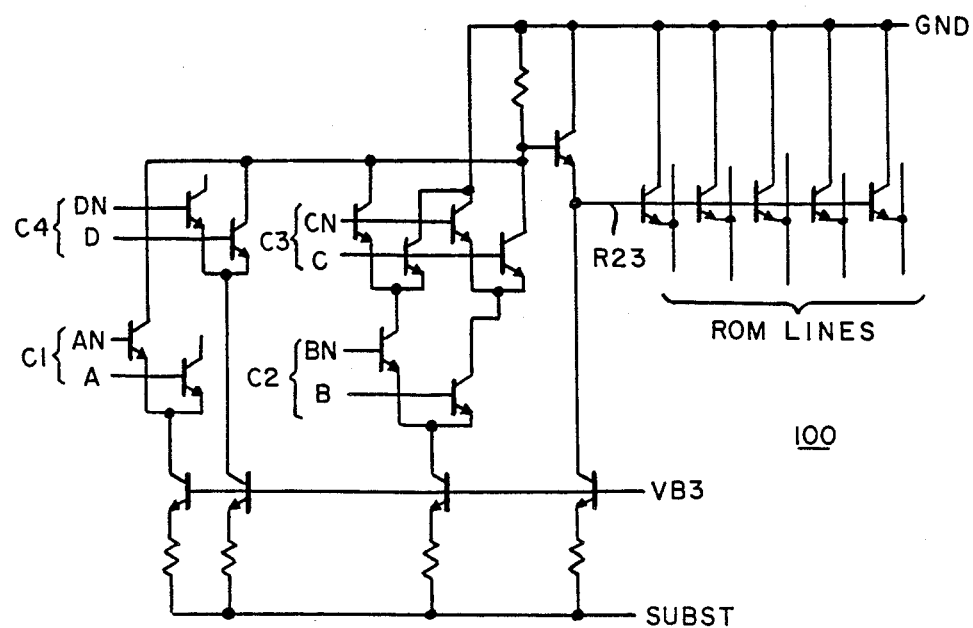
FIG. 6 is a table illustrating the effect and operation of the method of FIG. 5.
FIG. 7 is a schematic diagram of a circuit which may be used to perform the method of FIG. 5 by concurrently correcting the comparator output values and finding the zeroes-to-ones transition point.
FIG. 10 is a flow diagram illustrating the steps of the method according to the enhancement of the present invention implemented in FIG. 9.

FIG. 6 shows how this method would be applied to the example of FIG. 4A. Comparator output C(3)=1 is flanked by comparator outputs C(2)=0 and C(4)=0. Thus, the output of comparator C(2) is changed to 0; that is, C'(3)=0=C(3)*, where C'(3) is the corrected output and the asterisk indicates logical negation or inversion. Comparator output C(2)=0, however, is flanked by C(3)=1 and C(1)=1, so C'(2)=1=C(2)*. Note that each value of the corrected comparator output C'(n) is calculated from the unmodified values of the triad of comparator outputs. Looking at the C'(n) column of FIG. 6, it will be seen that the "bubble" has been removed. This approach will successfully remove the bubbles of FIGS. 4B and 4C, but fails in the extreme case of FIG. 4D. The error shown in FIG. 4D represents serious degradation, however, and should only happen between different blocks of comparators. Other (so-called "second-tier") circuitry may be used to correct such errors. Note, further, that it does not matter how "deep" in the "mercury" a bubble is; the error will still be corrected. In fact, a stuck comparator in either state which would disable whole sections of code in a traditional decoding scheme will only cause a single missing code when the present invention is used.

The Boolean logic equation for the corrected output C'(n) for comparator n is:

$$C'(n) = [C(n-1)C(n)] + [C(n)C(n+1)] +$$
$$[C(n-1)C(n+1)].$$

Once the comparator outputs have been "corrected", the zeroes-to-ones transition point may be found. Conceptually, this can be done by finding in the corrected comparator outputs a zero above a one, using a two-input gate. This decoding technique will find the "best guess" output code at position 82 in FIG. 4A (i.e., it will split the difference between positions 81 and 83).

Finding the zeroes-to-ones transition point and generating a representation of the value indicated by the location of that transition point is generally referred to as "encoding." In a typical system, a ROM is used to perform the encoding operation. The zeroes-to-ones transition is defined by $R_{n(n+1)}=C'(n) \ C'(n+1)^*$, where the * indicates a negation of logic state and $R_{n(n+1)}$ is the ROM address line. In practice, the two steps (majority voting and ones/zeroes transition identification) can be combined into a single operation. After a little Boolean algebra on the foregoing equation, we have:

$$R_{n(n+1)} = [C(n-1) \ C(n) \ C(n+1)^* \ C(n+2)^*] +$$
$$[C(n-1)C(n)^* \ C(n+1) \ C(n+2)^*].$$

This indicates that the equivalent of the two-step operation described above can be provided by two four-input AND-gates and one OR gate. In the actual implementation, of the best mode (see FIG. 7) however, a different form of the expression is used:

$$R_{n(n+1)} = C(n-1) \ C(n+2)^* \ [C(n) \ XOR \ C(n+1)] \quad (98)$$

where XOR represents the exclusive-OR operator. Equation 98 leads to very efficient hardware implementation.

The method of the present invention only has commercial value if it can be implemented with a simple circuit. The decision circuit must be replicated once per comparator. When, for example, 256 comparators are used (e.g., for an 8-bit digital word), the replication of the decision circuitry creates a large, power-hungry die if the decision circuitry is too elaborate.

FIG. 7 shows an exemplary circuit 100 for implementing this invention, based on equation 98. Series gating allows for efficient implementation of the exclusive-OR of the C(n) and C(n+1) signals. The other two terms, C(n−1) and C(n+2), are incorporated by using only one additional current source at each comparator.

Figure 8:
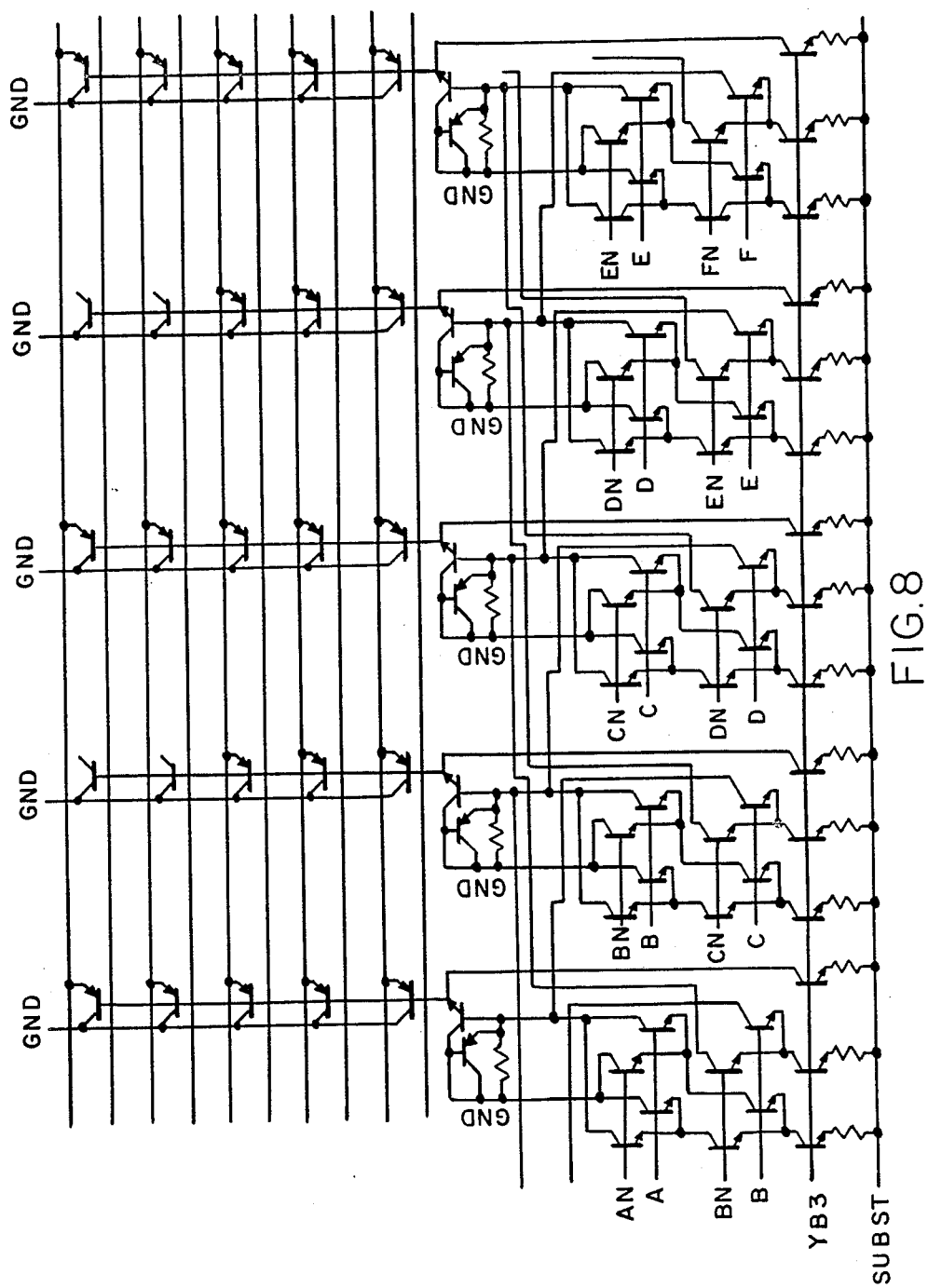
FIG. 8 is a schematic circuit diagram illustrating how several stages of the circuit of FIG. 7 may be interconnected.

This is shown in the expanded schematic diagram in FIG. 8. A total of only three current sources are required per comparator.

This circuit makes up about 16% of the comparator area, or less than 5% of the total die in a typical product. The additional power required for an implementation using VLSI bipolar technology is about 110 mW, which is just a few percent of the total power consumed by the chip.

Figure 9:
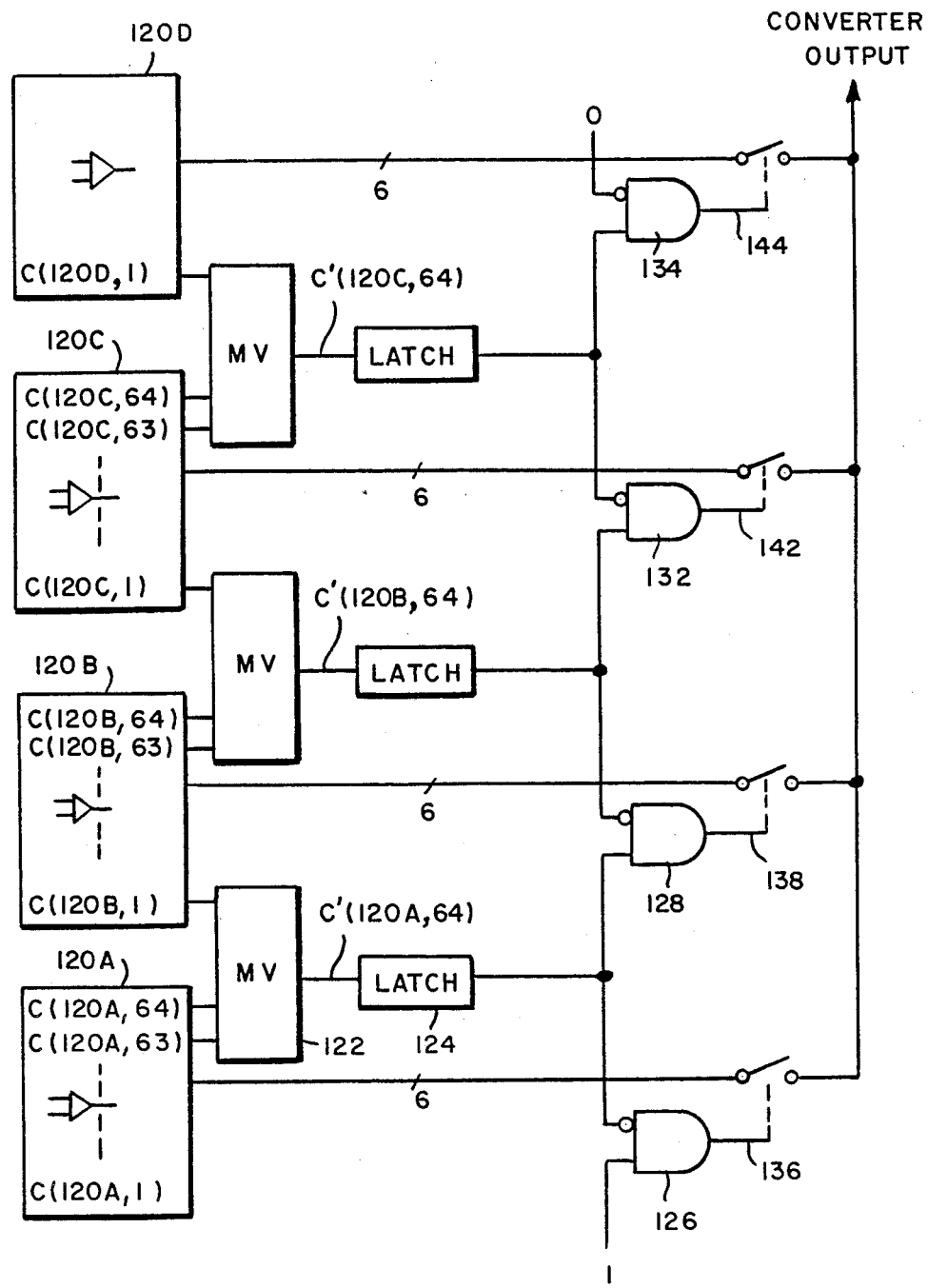
FIG. 9 is a block diagram for apparatus according to an aspect of the invention, for use in correcting (i.e., suppressing) conversion errors occurring between blocks of comparators in a parallel conversion integrated circuit.

As illustrated in FIG. 9, the comparators may be laid out in an integrated circuit chip in two or more daisy-chained banks or segments, such as the four banks 120A–120D (of course, the choice of four banks is merely exemplary, as a greater or lesser number of banks may be used in practice). Each of banks 120A–120D has sixty-four comparators providing a like number of bits of output, labelled C(j, 1)–C(j, 64) where "j" represents the number of the bank. While the method of FIG. 5 may be applied to the outputs of all of the comparators in the four banks, treating them as 256 values along a continuous voltage divider, an enhancement proves useful to exploit this segmented lay-out. According to this enhancement, a two-tier, or two-rank error correction is employed. First, the method of FIG. 5 is performed separately on each bank, to correct errors within each bank. Second, an error correction is made across the boundaries between electrically adjacent pairs of comparator banks. This second-tier correction also is based on a majority vote function.

Considering an exemplary pair of adjacent banks 120A and 120B, a majority vote circuit 122 generates from the two most significant comparator outputs C(120A, 63) and C(120A, 64) of bank 120A and the least significant comparator output C(120B, 1) of bank 120B a corrected comparator output C'(120A, 64). The corrected output C'(120A, 64) is latched in a latch 124. Pairs of values of C'(x, 64), where x covers the range of bank numbers, are then compared for each pair of electrically adjacent comparator banks (i.e., each possible combination of x and x+1) by gates 126, 128 and 132, to find a ones-to-zeroes transition in the values C'(x, 64). In FIG. 9, each of the blocks 120A–120D generates a six-bit answer. If the zeroes-to-ones transition in the thermometer code occurs in a particular block (which for ease of reference will be called the "transition" block), the output of that block is used as the six least significant bits in the overall converter output. The output of all blocks whose positions on the divider are "below" that of the transition block will be a six-bit code of all ones (i.e., 111111); the output of all blocks whose positions on the divider are "above" that of the transition block will be a six-bit code of all zeroes (i.e., 000000). The signals 136, 138, 142 and 144 at the outputs of gates 126, 128, 132 and 134, respectively, constitute the signals which identify the transition block. The six-bit output of the transition block is passed to the overall converter output along with two bits which identify the transition block; these two bits are appended as the two most significant bits (msb's). The values of the two msb's are assigned in accordance with the following table:

| Signal | Block | MSB's |
| --- | --- | --- |
| 136 | 120A | 00 |
| 138 | 120B | 01 |
| 142 | 120C | 10 |
| 144 | 120D | 11 |

Only one of the signals in the first column should be high (i.e., 1) at a time. If, for example, signal 142 is high, then the six-bit answer from block 120C is used and the two MSB's are 10.

FIG. 10 illustrates a self-explanatory flow diagram for the inter-bank (i.e., second-tier) error correction.

Other schemes may be used, of course, for implementing bank selection or bank inhibition. For example, a trivial variation on the above-discussed implementation would be to use a corrected version of the output of the comparator in the least significant position in each bank to identify the bank containing the ones-to-zeroes transition.

The present invention thus may be viewed more generally as a pattern matching system, which detects certain comparator output patterns considered to represent corrupted data and which then substitutes for the corrupted data other data believed to reliably correct for the corruption. In contrast with prior art comparator decoding schemes which look only for a single pattern to find the ones-to-zeroes transition point (e.g., a pattern such as 10, 110, or 100), the present invention looks for either of two patterns: 1100 or 1010. With this teaching in front of them, those skilled in the art will appreciate that the number of patterns to be identified can be expanded and longer patterns can be matched, so that two-bit errors such as the one shown in FIG. 4D can be resolved.

Of course, the circuitry illustrated herein is presented by way of example only and is not limiting of the invention. Other circuits and various modifications and changes will readily occur to those familiar with the art, from a reading of the foregoing disclosure. The preceding description of the invention is thus illustrative only. The invention is limited only as required by the following claims and equivalents thereto.

What is claimed is:

1. A parallel type analog-to-digital converter for converting an input analog signal to a corresponding digital form, comprising:
   a. a voltage divider providing a plurality of N voltage divider taps;
   b. a plurality of comparators, each comparator having first and second inputs and an output;
   c. one of the first and second inputs of each comparator being connected to a respective one of the voltage divider taps and the other of the comparator inputs being connected to receive the input analog signal; and
   d. means for generating for each comparator "n", where n ranges from 0 to N, a corrected comparator output C'(n) in response to the output C(n) of comparator n and the outputs of comparators n+1 and n−1, where comparators n−1, n and n+1 are connected to consecutive electrically adjacent taps of the voltage divider, such that $$C'(n) = C(n-1)\,C(n) + C(n)\,C(n+1) + C(n-1)\,C(n+1).$$

2. The apparatus of claim 1 further including means for identifying the zeroes-to-ones transition point in the set of corrected comparator outputs C'(x), where x ranges from 0 to N, the highest numbered tap of the resistive divider.

3. The apparatus of claim 1 or claim 2 further including means for providing fictitious comparator output values $C(-1)=C(-2)=1$ and $C(N+1)=C(N+2)=0$.

4. A parallel type analog-to-digital converter for converting an input analog signal to a corresponding digital form, comprising:
   a. a voltage divider providing a plurality of N voltage divider taps;
   b. a plurality of comparators, each comparator having first and second inputs and an output;
   c. one of the first and second inputs of each comparator being connected to a respective one of the voltage divider taps and the other of the comparator inputs being connected to receive the input analog signal;
   d. each of a triad of comparators $n-1$, n and $n+1$ being connected to a respective one of a triad of consecutive electrically adjacent taps of the divider;
   e. a read-only memory (ROM) for encoding the comparator outputs;
   f. means for generating the function $R_{n(n+1)}$ to address the ROM, where $R_{n(n+1)}=[C(n-1)\ C(n)\ C(n+1)^*\ C(n+2)^*]+[C(n-1)\ C(n)^*\ C(n+1)\ C(n+2)^*]$, the expression $C(n)$ signifying the output of comparator n and $C(n)^*$ signifying the logical negation of $C(n)$.

5. A parallel type analog-to-digital converter for converting an input analog signal to a corresponding digital form, comprising:
   a. a voltage divider providing a plurality of N voltage divider taps;
   b. a plurality of comparators, each comparator having first and second inputs and an output;
   c. one of the first and second inputs of each comparator being connected to a respective one of the voltage divider taps and the other of the comparator inputs being connected to receive the input analog signal;
   d. each of a triad of comparators $n-1$, n and $n+1$ being connected to a respective one of a triad of successive consecutive taps of the voltage divider;
   e. a read-only memory (ROM) for encoding the comparator outputs;
   f. means for generating the function $R_{n(n+1)}$ to address the ROM, where $R_{n(n+1)}=C(n-1)\ C(n+2)^*[C(n)\ \text{XOR}\ C(n+1)]$, the expression $C(n)$ signifying the output of comparator n and $C(n)^*$ signifying the logical negation of $C(n)$.

6. In a parallel type analog-to-digital converter of the type having (a) a voltage divider providing a plurality of N voltage divider taps; (b) a plurality of comparators, each comparator having first and second inputs and an output; and (c) one of the first and second inputs of each comparator being connected to a respective one of the voltage divider taps and the other of the comparator inputs being connected to receive the input analog signal; a method of decoding the comparator outputs, comprising the steps of:
   a. generating for each comparator "n" a corrected comparator output $C'(n)$ in response to the output $C(n)$ of comparator n and the outputs of comparators $n+1$ and $n-1$, where comparators $n-1$, n and $n+1$ are connected to consecutive, electrically adjacent taps of the voltage divider, such that $C'(n)=C(n-1)\quad C(n)+C(n)\quad C(n+1)+C(n-1)\ C(n+1)$; and b. identifying the zeroes-to-ones transition point in the set of corrected comparator outputs $C'(x)$, where x ranges from 0 to N, the highest numbered tap of the divider.

7. The method of claim 6 further including the step of providing fictitious comparator output values $C(-1)=C(-2)=1$ and $C(N+1)=C(N+2)=0$.

8. In a parallel type analog-to-digital converter of the type having (a) a voltage divider providing a plurality of N voltage divider taps; (b) a plurality of comparators, each comparator having first and second inputs and an output; (c) one of the first and second inputs of each comparator being connected to a respective one of the voltage divider taps and the other of the comparator inputs being connected to receive the input analog signal; (d) each of a triad of comparators $n-1$, n and $n+1$ being connected to a respective one of a triad of consecutive electrically adjacent taps of the voltage divider; and (e) a read-only memory (ROM) for encoding the comparator outputs; a method of decoding the comparator outputs, comprising the step of generating the function $R_{n(n+1)}$ to address the ROM, where $$R_{n(n+1)} = [C(n-1)\ C(n)\ C(n+1)^*\ C(n+2)^*] + [C(n-1)C(n)^*\ C(n+1)\ C(n+2)^*],$$

the expression $C(n)$ signifying the output of comparator n and $C(n)^*$ signifying the logical negation of $C(n)$.

9. In a parallel type analog-to-digital converter of the type having (a) a voltage divider providing a plurality of N voltage divider taps; (b) a plurality of comparators, each comparator having first and second inputs and an output; (c) one of the first and second inputs of each comparator being connected to a respective one of the voltage divider taps and the other of the comparator inputs being connected to receive the input analog signal; (d) each of a triad of comparators $n-1$, n and $n+1$ being connected to a respective one of a triad of successive consecutive taps of the voltage divider; and (e) a read-only memory (ROM) for encoding the comparator outputs; a method of decoding the comparator outputs, comprising the step of generating the function $R_{n(n+1)}$ to address the ROM, where $$R_{n(n+1)} = C(n-1)\ C(n+2)^*\ [C(n)\ \text{XOR}\ C(n+1)],$$

the expression $C(n)$ signifying the output of comparator n and $C(n)^*$ signifying the logical negation of $C(n)$.

10. A parallel type analog-to-digital converter for converting an input analog signal to a corresponding digital form, comprising:
   a. a voltage divider providing a plurality of N voltage divider taps;
   b. a plurality of comparators, each comparator having first and second inputs and an output;
   c. one of the first and second inputs of each comparator being connected to a respective one of the voltage divider taps and the other of the comparator inputs being connected to receive the input analog signal;
   d. the comparators being physically segregated into a plurality of comparator banks, each bank containing a group of electrically adjacent ones of the comparators;

e. means for generating for the computer in the most significant position in a bank a corrected comparator output value representing the majority value of the output of that comparator, the output of the comparator in the second most significant position in that bank and the output of the comparator in the least significant position in the bank which is electrically adjacent to the comparator in the most significant position; and f. means for identifying the bank containing the zeroes-to-ones transition point in the set of all comparator outputs, for a given analog input signal.

11. A parallel type analog-to-digital converter for converting an input analog signal to a corresponding digital form, comprising:

a. a voltage divider providing a plurality of N voltage divider taps;

b. a plurality of comparators, each comparator having first and second inputs and an output;

c. one of the first and second inputs of each comparator being connected to a respective one of the voltage divider taps and the other of the comparator inputs being connected to receive the input analog signal;

d. the comparators being physically segregated into a plurality of comparator banks, each bank containing a group of electrically adjacent ones of the comparators;

e. means for generating for each comparator "n" in each comparator bank "j", other than the comparator in the most significant position in the bank, a corrected comparator output $C'(j, n)$ in response to the output $C(j, n)$ of comparator n in bank j and the outputs of comparators $n+1$ and $n-1$ in bank j, where comparators $n-1$, n and $n+1$ are connected to consecutive electrically adjacent taps of the voltage divider, such that $$C'(j, n) = C(j, n - 1) C(j, n) + C(j, n) C(j, n + 1) + C(j, n - 1) C(j, n + 1);$$

f. means for generating for the comparator in the most significant position in a bank "j" a corrected comparator output value $C'(j, msb)$ representing the majority value of the output of that comparator $C(j, msb)$, the output of the comparator in the second most significant position in that bank $C(j, msb-1)$ and the output of the comparator in the least significant position in the bank which is electrically adjacent to the comparator in the most significant position $C(j+1, 1\ sb)$; and g. means for identifying the bank containing the zeroes-to-ones transition point in the set of all comparator outputs, for a given analog input signal.

* * * * *